(12) United States Patent
Warner

(10) Patent No.: US 6,731,217 B1
(45) Date of Patent: May 4, 2004

(54) ELECTRICAL CIRCUIT TESTER

(76) Inventor: Michael A. Warner, 17 N. Mulberry St., Apt. 34, Hagerstown, MD (US) 21740

(*) Notice: Subject to any disclaimer, the term of this patent is extended or adjusted under 35 U.S.C. 154(b) by 0 days.

(21) Appl. No.: 10/242,859

(22) Filed: Sep. 13, 2002

(51) Int. Cl.[7] ............................................... G08B 21/00
(52) U.S. Cl. ...................... 340/650; 340/654; 340/656; 340/649; 324/556; 324/555; 324/114; 324/133; 324/156
(58) Field of Search ............................... 340/650, 654, 340/656, 649; 324/556, 555, 114, 133, 156

(56) References Cited

U.S. PATENT DOCUMENTS

| | | | |
|---|---|---|---|
| 4,127,807 A | | 11/1978 | Peplow et al. |
| 4,280,092 A | * | 7/1981 | Wells et al. ................. 324/508 |
| 4,945,346 A | | 7/1990 | Schmiemann |
| D312,583 S | | 12/1990 | Kopp |
| 5,109,200 A | | 4/1992 | Dushane et al. |
| 5,285,163 A | | 2/1994 | Liotta |
| 5,331,283 A | | 7/1994 | Sheldon |
| 5,604,436 A | * | 2/1997 | Henritzy et al. ............ 324/414 |
| 6,020,822 A | * | 2/2000 | Marshall ..................... 340/654 |
| 6,462,555 B1 | * | 10/2002 | Schaefer ..................... 324/508 |

* cited by examiner

Primary Examiner—Daniel J. Wu
Assistant Examiner—Tai T. Nguyen

(57) ABSTRACT

An electrical circuit tester for allowing a user to efficiently test electrical fixtures and switches. The electrical circuit tester includes a housing that has a plurality of prongs that extend from the housing. The prongs are adapted for engaging an electrical outlet of a building. A plurality of lights is coupled to the housing. The lights are lit in a pattern indicating a state of the electrical outlet. A speaker is coupled to the housing. The speaker is for creating an audible tone when the prongs engage the electrical outlet.

5 Claims, 2 Drawing Sheets

ELECTRICAL CIRCUIT TESTER

BACKGROUND OF THE INVENTION

1. Field of the Invention

The present invention relates to electrical testers and more particularly pertains to a new electrical circuit tester for allowing a user to efficiently test electrical fixtures and switches.

2. Description of the Prior Art

The use of electrical testers is known in the prior art. More specifically, electrical testers heretofore devised and utilized are known to consist basically of familiar, expected and obvious structural configurations, notwithstanding the myriad of designs encompassed by the crowded prior art which have been developed for the fulfillment of countless objectives and requirements.

Known prior art includes U.S. Pat. Nos. 5,285,163; 5,331,283; 4,127,807; Des. 312,583; U.S. Pat. Nos. 5,109,200; and 4,945,346.

While these devices fulfill their respective, particular objectives and requirements, the aforementioned patents do not disclose a new electrical circuit tester. The inventive device includes a housing that has a plurality of prongs that extend from the housing. The prongs are adapted for engaging an electrical outlet of a building. A plurality of lights is coupled to the housing. The lights are lit in a pattern indicating a state of the electrical outlet. A speaker is coupled to the housing. The speaker is for creating an audible tone when the prongs engage the electrical outlet.

In these respects, the electrical circuit tester according to the present invention substantially departs from the conventional concepts and designs of the prior art, and in so doing provides an apparatus primarily developed for the purpose of allowing a user to efficiently test electrical fixtures and switches.

SUMMARY OF THE INVENTION

In view of the foregoing disadvantages inherent in the known types of electrical testers now present in the prior art, the present invention provides a new electrical circuit tester construction wherein the same can be utilized for allowing a user to efficiently test electrical fixtures and switches.

The general purpose of the present invention, which will be described subsequently in greater detail, is to provide a new electrical circuit tester apparatus and method which has many of the advantages of the electrical testers mentioned heretofore and many novel features that result in a new electrical circuit tester which is not anticipated, rendered obvious, suggested, or even implied by any of the prior art electrical testers, either alone or in any combination thereof.

To attain this, the present invention generally comprises a housing that has a plurality of prongs that extend from the housing. The prongs are adapted for engaging an electrical outlet of a building. A plurality of lights is coupled to the housing. The lights are lit in a pattern indicating a state of the electrical outlet. A speaker is coupled to the housing. The speaker is for creating an audible tone when the prongs engage the electrical outlet.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new electrical circuit tester apparatus and method which has many of the advantages of the electrical testers mentioned heretofore and many novel features that result in a new electrical circuit tester which is not anticipated, rendered obvious, suggested, or even implied by any of the prior art electrical testers, either alone or in any combination thereof.

It is another object of the present invention to provide a new electrical circuit tester, which may be easily and efficiently manufactured and marketed.

It is a further object of the present invention to provide a new electrical circuit tester, which is of a durable and reliable construction.

An even further object of the present invention is to provide a new electrical circuit tester which is susceptible of a low cost of manufacture with regard to both materials and labor, and which accordingly is then susceptible of low prices of sale to the consuming public, thereby making such electrical circuit tester economically available to the buying public.

Still yet another object of the present invention is to provide a new electrical circuit tester which provides in the apparatuses and methods of the prior art some of the advantages thereof, while simultaneously overcoming some of the disadvantages normally associated therewith.

Still another object of the present invention is to provide a new electrical circuit tester for allowing a user to efficiently test electrical fixtures and switches.

Yet another object of the present invention is to provide a new electrical circuit tester which includes a housing that has a plurality of prongs that extend from the housing. The prongs are adapted for engaging an electrical outlet of a building. A plurality of lights is coupled to the housing. The lights are lit in a pattern indicating a state of the electrical outlet. A speaker is coupled to the housing. The speaker is for creating an audible tone when the prongs engage the electrical outlet.

Still yet another object of the present invention is to provide a new electrical circuit tester that saves time and is easy and safe to use preventing electrocution accidents as a result of testing outlets and switches.

Even still another object of the present invention is to provide a new electrical circuit tester that is of versatile design for allowing a user to test light switches and fixtures and eliminates the need for assistance from another person to help with the testing.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
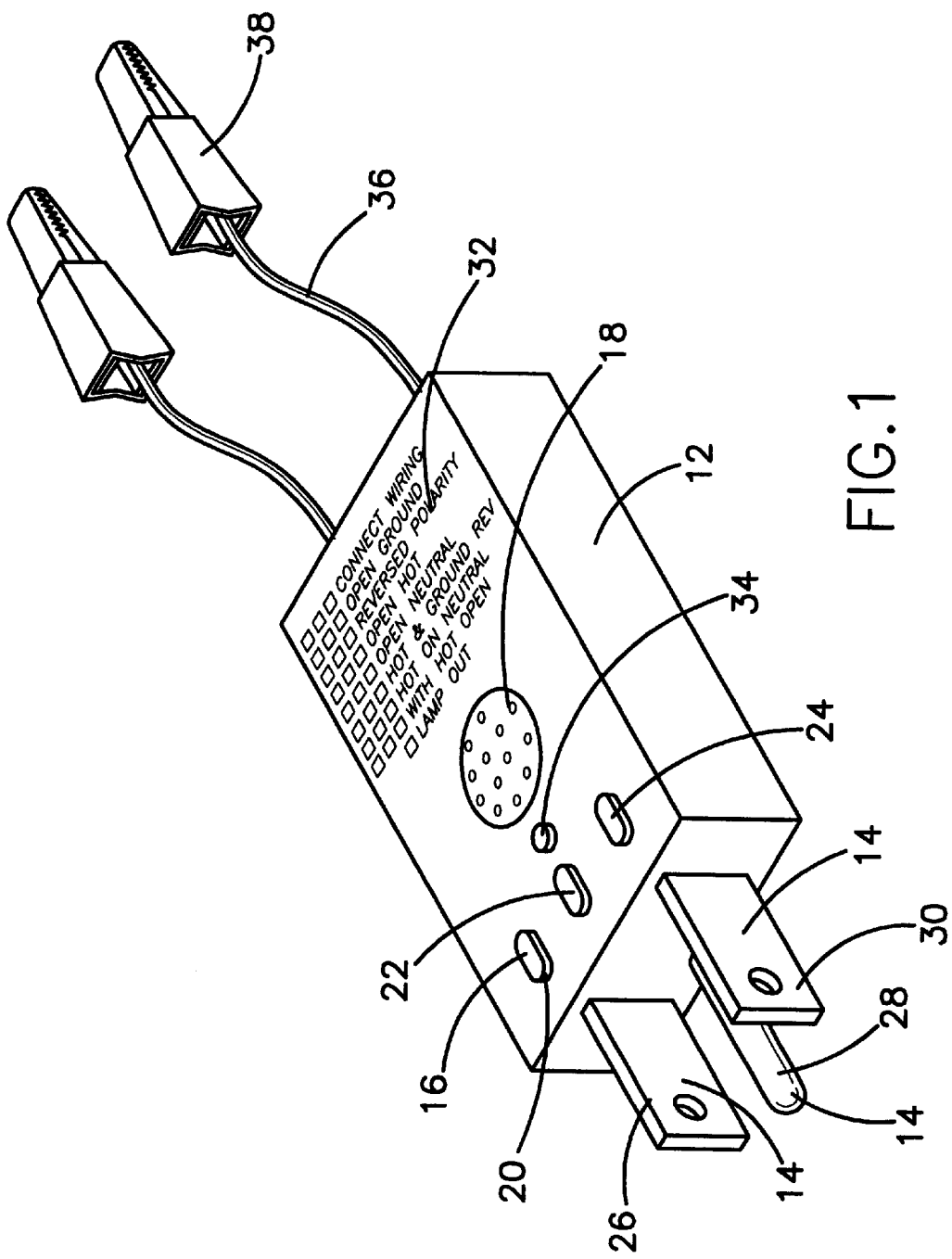
FIG. 1 is a perspective view of a new electrical circuit tester according to the present invention.
Figure 2:
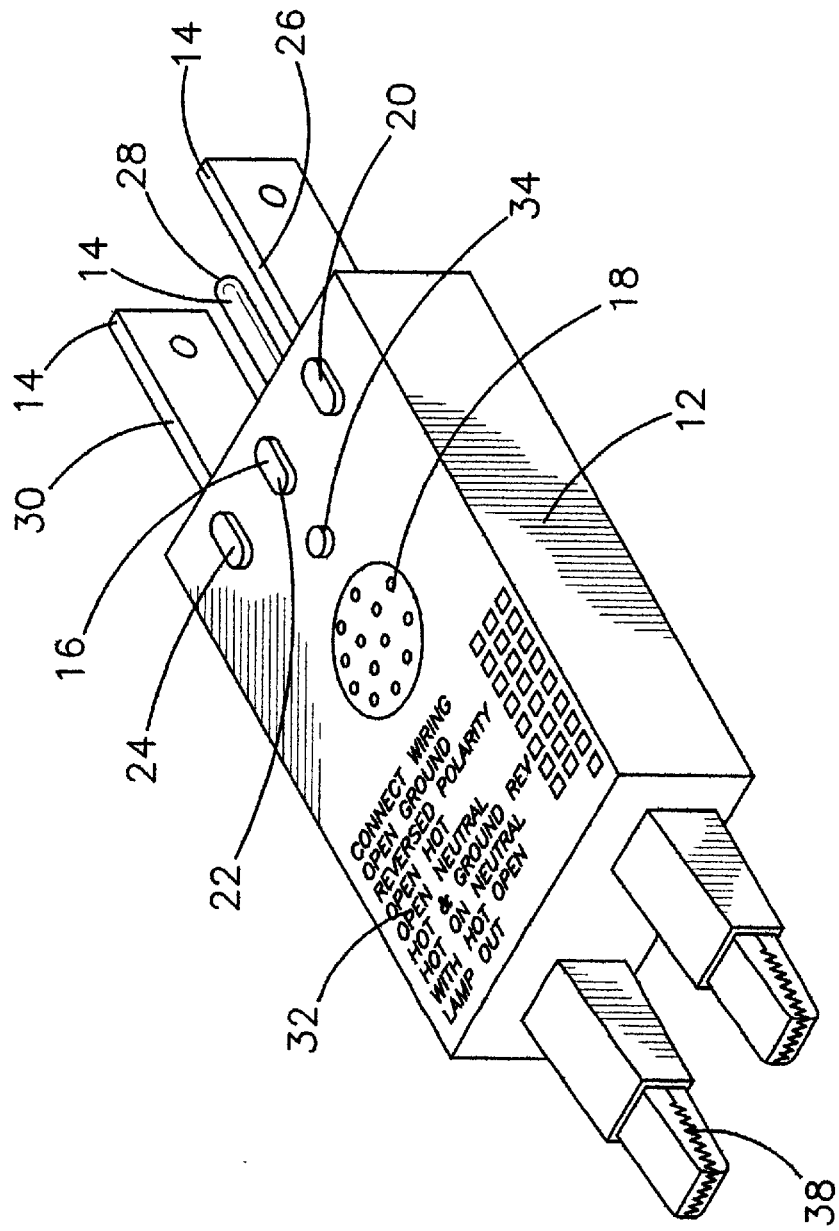
FIG. 2 is a perspective view of the present invention.

With reference now to the drawings, and in particular to FIGS. 1 through 2 thereof, a new electrical circuit tester embodying the principles and concepts of the present invention and generally designated by the reference numeral 10 will be described.

As best illustrated in FIGS. 1 through 2, the electrical circuit tester 10 generally includes a housing 12 that has a plurality of prongs 14 that extend from the housing 12. The prongs 14 are adapted for engaging an electrical outlet of a building. A plurality of lights 16 is coupled to the housing 12. The lights 16 are lit in a pattern indicating a state of the electrical outlet. A speaker 18 is coupled to the housing 12. The speaker 18 is for creating an audible tone when the prongs 14 engage the electrical outlet.

The plurality of lights 16 includes a first light 20, a second light 22 and a third light 24. The first light 20 is associated with a first 26 one of the prongs. The second light 22 is associated with a second 28 of the prongs. The third light 24 is associated with a third 30 of the prongs. The lights 16 are for emitting light upon current passing through the associated prongs 14. The housing 12 has a status indicia 32. The status indicia 32 are for indicating a status of the outlet upon comparison of the status indicia 32 with the lights 16 that are lit when the prongs 14 engage the electrical outlet.

A testing button 34 is coupled to the housing 12. The testing button 34 is adapted for testing ground fault circuit interrupters of the electrical outlet.

A pair of test leads 36 is for extending from the housing 12. Each of the test leads 36 has a clip 38 coupled to an end of the respective test lead 36. The clip 38 of each of the test leads 36 is adapted for operationally coupling to opposing poles of the switch such that the speaker 18 audibly emits a sound when the clip 38 of each of the test leads 36 are coupled to the poles of the switch. Each of the test leads 36 extends through the housing 12 such that the test leads 36 may be retracted into the housing 12.

In use, a user would connect the present invention to an electrical outlet to test the condition of the outlet. The present invention can also be used to test the condition of light switches using the clip leads on the tester. The present invention tests for the following conditions; correct wiring when the second light is lit, an open ground when the second and the third light are lit, reversed polarity when the third is lit, an open hot when all three lights are lit, an open neutral when the first light and the second are lit, the hot and ground reversed when the first light is lit, a hot on neutral with hot open when the first and the third lights are lit, lamp out when the lamp out light is lit. The speaker can be audibly heard such that the user can go to a breaker box and determine which breaker the switch or outlet is on by actuating the breakers until the speaker no longer emits an audible tone.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. An electrical circuit tester for testing an electrical outlet and a switch of a building, the electrical circuit tester comprising;

a housing having a plurality of prongs extending from said housing, said prongs being adapted for engaging an electrical outlet of a building;

a plurality of lights being coupled to said housing, said lights being lit in a pattern indicating a state of the electrical outlet;

a speaker being coupled to said housing, said speaker being for creating an audible tone when said prongs engage the electrical outlet;

a pair of test leads extending from said housing, each of said test leads having a clip coupled to an end of said respective test lead, said clip of each of said test leads being adapted for operationally coupling to opposing poles of the switch such that said speaker audibly emits a sound when said clip of each of said test leads are coupled to the poles of the switch; and wherein each of said test leads extends through said housing such that said test leads may be retracted into said housing.

2. The electrical circuit tester as set forth in claim 1, wherein said plurality of lights comprises a first light, a second light and a third light, said first light being associated with a first one of said prongs, said second light being associated with a second of said prongs, said third light being associated with a third of said prongs, said lights being for emitting light upon current passing through said associated prongs.

3. The electrical circuit tester as set forth in claim 2, wherein said housing has a status indicia, said status indicia being for indicating a status of the outlet upon comparison of said status indicia with said lights that are lit when said prongs engage the electrical outlet.

4. The electrical circuit tester as set forth in claim 1, further comprising:
- a testing button being coupled to said housing, said testing button being adapted for testing ground fault circuit interrupters of the electrical outlet.

5. An electrical circuit tester for testing an electrical outlet and a switch of a building, the electrical circuit tester comprising;
- a housing having a plurality of prongs extending from said housing, said prongs being adapted for engaging an electrical outlet of a building;
- a plurality of lights being coupled to said housing, said lights being lit in a pattern indicating a state of the electrical outlet; and
- a speaker being coupled to said housing, said speaker being for creating an audible tone when said prongs engage the electrical outlet;
- wherein said plurality of lights comprises a first light, a second light and a third light, said first light being associated with a fist one of said prongs, said second light being associated with a second of said prongs, said third light being associated with a third of said prongs, said lights being for emitting light upon current passing through said associated prongs;
- wherein said housing has a status indicia, said status indicia being for indicating a status of the outlet upon comparison of said status indicia with said lights that are lit when said prongs engage the electrical outlet;
- wherein a testing button being coupled to said housing, said testing button being adapted for testing ground fault circuit interrupters of the electrical outlet;
- wherein a pair of test leads extending from said housing, each of said test leads having a clip coupled to an end of said respective test lead, said clip of each of said test leads being adapted for operationally coupling to opposing poles of the switch such that said speaker audibly emits a sound when said clip of each of said test leads are coupled to the poles of the switch;
- wherein each of said test leads extends through said housing such that said test leads may be retracted into said housing.

\* \* \* \* \*